United States Patent
Sachs et al.

(10) Patent No.: US 10,154,595 B2
(45) Date of Patent: Dec. 11, 2018

(54) ELECTRICAL COMPONENTS AND METHODS AND SYSTEMS OF MANUFACTURING ELECTRICAL COMPONENTS

(71) Applicants: Tyco Electronics Corporation, Berwyn, PA (US); Tyco Electronics AMP GmbH, Bensheim (DE)

(72) Inventors: Soenke Sachs, Frankfurt am Main (DE); Helge Schmidt, Speyer (DE); Michael Leidner, Lambrecht (DE); Eva Henschel, Duisburg (DE); Dominique Freckmann, San Francisco, CA (US); Marjorie Myers, Mount Wolf, PA (US)

(73) Assignees: TE CONNECTIVITY CORPORATION, Berwyn, PA (US); TE CONNECTIVITY GERMANY GMBH, Bensheim (DE)

( * ) Notice: Subject to any disclaimer, the term of this patent is extended or adjusted under 35 U.S.C. 154(b) by 0 days.

(21) Appl. No.: 14/711,453

(22) Filed: May 13, 2015

(65) Prior Publication Data

US 2015/0319865 A1    Nov. 5, 2015

Related U.S. Application Data

(62) Division of application No. 13/836,861, filed on Mar. 15, 2013, now abandoned.

(Continued)

(51) Int. Cl.
*H05K 3/00* (2006.01)
*H05K 3/10* (2006.01)
(Continued)

(52) U.S. Cl.
CPC ............... *H05K 3/105* (2013.01); *H05K 1/02* (2013.01); *H05K 3/0091* (2013.01);
(Continued)

(58) Field of Classification Search
CPC .......... H05K 3/00; H05K 1/00; H05K 427/00; H05K 2203/092; C23C 18/00
See application file for complete search history.

(56) References Cited

U.S. PATENT DOCUMENTS 3,081,485 A * 3/1963 Steigerwald ............ D02J 1/224
                                                 118/620
3,294,951 A * 12/1966 Olson .................. B23K 1/0056
                                                 219/114

(Continued)

FOREIGN PATENT DOCUMENTS

CN       102326460 A      1/2012
JP       2000106404   *   4/2000

(Continued)

OTHER PUBLICATIONS

JP 2005-256054, A english translation.*

*Primary Examiner* — David P Turocy
*Assistant Examiner* — Mohammad Mayy

(57) ABSTRACT

A method of manufacturing an electrical component includes providing an electrically insulating substrate having an outer surface, applying a coated structure on the outer surface and irradiating the coated structure with an electron beam to form an electrical conductor on the substrate. The irradiating may include heating the coating layer to melt the coating layer to form the electrical conductor. The coating layer may have a low binder concentration and a high metal concentration. The irradiating may include vaporizing substantially all the binder leaving a substantially pure metallic layer to form the electrical conductor. The coating layer may (Continued)

be irradiated until non-metallic material of the coating layer is completely removed.

19 Claims, 3 Drawing Sheets

Related U.S. Application Data

(60) Provisional application No. 61/710,365, filed on Oct. 5, 2012.

(51) Int. Cl.
*H05K 1/02* (2006.01)
*H05K 3/12* (2006.01)

(52) U.S. Cl.
CPC ..... *H05K 3/1283* (2013.01); *H05K 2203/092* (2013.01); *H05K 2203/111* (2013.01); *H05K 2203/1157* (2013.01)

(56) References Cited

U.S. PATENT DOCUMENTS

| | | | |
|---|---|---|---|
| 4,536,468 A * | 8/1985 | Yasui | C08F 283/00 427/510 |
| 5,599,468 A | 2/1997 | Mako et al. | |
| 5,780,970 A * | 7/1998 | Singh | H01J 23/0275 315/5.38 |
| 5,825,123 A * | 10/1998 | Retsky | H01J 29/701 313/413 |
| 5,855,755 A | 1/1999 | Murphy et al. | |
| 5,897,794 A | 4/1999 | Hubbard et al. | |
| 6,312,791 B1 | 11/2001 | Fasano et al. | |
| 6,335,077 B1 | 1/2002 | Tani et al. | |
| 7,069,645 B2 | 7/2006 | Ishikawa et al. | |
| 7,321,098 B2 | 1/2008 | Sarma et al. | |
| 7,447,032 B2 | 11/2008 | Ishikawa | |
| 7,833,427 B2 | 11/2010 | Rueger et al. | |
| 2003/0091751 A1 * | 5/2003 | Tsuruta | G06K 19/07749 427/487 |
| 2004/0137710 A1 * | 7/2004 | Grigoropoulos | H01L 21/4867 438/622 |
| 2004/0209190 A1 * | 10/2004 | Mori | G03F 7/7075 430/311 |
| 2005/0191439 A1 * | 9/2005 | Hirose | B41M 7/0081 428/32.1 |
| 2005/0276912 A1 * | 12/2005 | Yamamoto | H01L 21/28008 427/117 |
| 2006/0275705 A1 | 12/2006 | Dorogy et al. | |
| 2006/0278853 A1 | 12/2006 | Yang | |
| 2007/0085033 A1 * | 4/2007 | Buller | B82Y 10/00 250/492.1 |
| 2009/0011143 A1 * | 1/2009 | Yatsunami | H05K 3/02 427/555 |
| 2012/0061130 A1 | 3/2012 | Yoshi et al. | |
| 2012/0269984 A1 | 10/2012 | Koshimizu et al. | |

FOREIGN PATENT DOCUMENTS

| | | | |
|---|---|---|---|
| JP | 2002 504751 A | | 2/2002 |
| JP | 2005256054 A | * | 9/2005 |
| JP | 2006026602 A | | 2/2006 |
| JP | 2010 192841 A | | 9/2010 |
| JP | 2011 150897 A | | 8/2011 |
| JP | 2012178486 A | | 9/2012 |
| KR | 2010 0137216 A | | 12/2010 |
| KR | 20120098391 A | | 9/2012 |
| WO | 99/43025 A1 | | 8/1999 |
| WO | 2011090103 A1 | | 7/2011 |

\* cited by examiner

ELECTRICAL COMPONENTS AND METHODS AND SYSTEMS OF MANUFACTURING ELECTRICAL COMPONENTS

CROSS REFERENCE TO RELATED APPLICATIONS

This application is a divisional of application Ser. No. 13/836,861, filed Mar. 15, 2013 titled ELECTRICAL COMPONENTS AND METHODS AND SYSTEMS OF MANUFACTURING ELECTRICAL COMPONENTS; which claims the benefit of U.S. Provisional Application No. 61/710,365 filed Oct. 5, 2012 titled ELECTRICAL COMPONENTS AND METHODS AND SYSTEMS OF MANUFACTURING ELECTRICAL COMPONENTS, the subject matter of each which are herein incorporated by reference in their entirety.

BACKGROUND OF THE INVENTION

The subject matter herein relates generally to electrical components and methods and systems of manufacturing electrical components.

Electrical components, such as circuit boards, typically have coating layers applied to substrates. For circuit boards, the coating layer may define a conductive trace or circuit on the circuit board and/or may be used to enhance electrical properties of the electrical components. The coating layers may enhance electrical properties such as by enhancing the conductivity of the electrical component and providing electrical connections between components which are assembled on the circuit board.

The coating layers are conductive metallic structures applied to the substrate. Application of such layers are typically accomplished either by deposition of the conductive metallic structures by using masks (e.g. vacuum evaporation, sputtering, chemical vapor deposition, plating) or by printing metallic pastes or inks on the substrate and then a subsequent thermal post-treatment. Problems exist for these conventional application processes. For example, the smallest producible feature sizes of the conductive metallic structures in deposition from a gas phase are limited by the structure sizes of the masks used (usually on the order of millimeters or greater), and a large part of the material used will not be utilized for the actual coating and must therefore be expensively recycled. Additionally, printed and conventionally thermally treated structures (e.g. in the oven) feature poorer electrical properties in comparison to pure metals, since the printing requires the addition of non-metallic additives such as glue, binder or additives to adjust the flow properties necessary for printing. In the thermal post-treatment these additives are only partially removed from the layer, causing the coating layer to have poorer electrical properties than coating layers having higher metallic contents, such as those approaching pure metal. Additionally, thermal stress during the deposition or during the thermal treatment is problematic. Some methods, such as MID (molded interconnect device) and LDS (laser direct structuring), use special polymers which contain metal catalysts. Use of specialty materials in such processes is expensive and the chemical coating process can take a very long time.

A need remains for methods and systems of manufacturing electrical components that are cost effective and produce high quality electrical components.

BRIEF DESCRIPTION OF THE INVENTION

In one embodiment, a method of manufacturing an electrical component is providing an electrically insulating substrate having an outer surface, applying a coated structure on the outer surface and irradiating the coated structure with an electron beam to form an electrical conductor on the substrate. The irradiating may include heating the coating layer to melt the coating layer to form the electrical conductor. The coating layer may have a low binder concentration and a high metal concentration. The irradiating may include vaporizing substantially all the binder leaving a substantially pure metallic layer to form the electrical conductor. The coating layer may be irradiated until non-metallic material of the coating layer is completely removed.

Optionally, the coating layer may be printed directly on the outer surface of the substrate and the coating layer may include metal precursors. The irradiating may chemically reduce the metal precursors to metals to form the electrical conductor. The irradiating may include reacting the metal precursors with the electrons of the electron beam to transform the coating layer.

Optionally, the method may include preheating the coating layer to a temperature below a melting point of the coating layer prior to irradiating the coating layer. The irradiating may heat the coating layer to a temperature above the melting point of the coating layer. Optionally, the method may include irradiating different portions of the coating layer differently to form a resistor in the electrical conductor. The irradiating may include controlling operating parameters of the electron beam based on the properties of the coating layer. Optionally, the coating layer may be electrically grounded during the irradiating process.

In another embodiment, an electrical component is provided including a substrate having an outer surface and a coating layer selectively applied to the outer surface. The coating layer is configured in a pre-processing state and in a post-processing state after irradiating with an electron beam. The coating layer is transformed from the pre-processing state to the post-processing state. An electron beam at least partially penetrates the coating layer during the irradiating process to transform the coating layer. Optionally, a non-metallic material content of the coating layer may be higher at the pre-processing state than the post-processing state. The non-metallic material may be removed during the irradiating process by the electron beam. The coating layer may have a low binder concentration when applied to the substrate, and substantially all of the binder may be removed during the irradiating process by the electron beam.

In a further embodiment, an electrical component forming system is provided including a chamber, an irradiation source generating electron beams and a substrate positioned in the chamber. The substrate has a coating layer selectively applied to the substrate. The electron beams at least partially penetrate the coating layer to form an electrical conductor on the substrate.

DETAILED DESCRIPTION OF THE INVENTION

Figure 1:
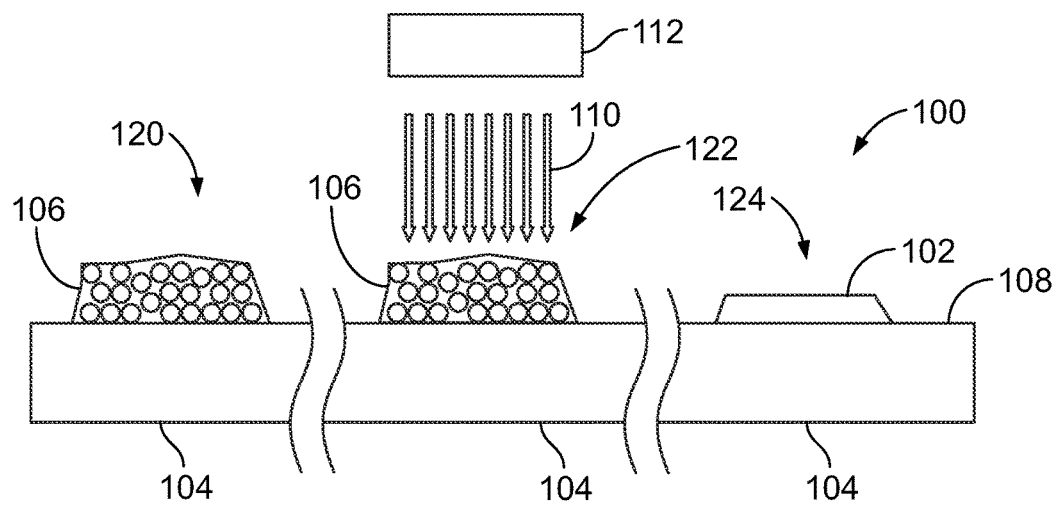
FIG. 1 illustrates an electrical component being processed to form an electrical conductor on a substrate.

Embodiments described herein include a method of manufacturing an electrical component that includes irradiating a coating layer with an electron beam to form an electrical conductor on a substrate. Embodiments described herein include a system that uses an electron beam to irradiate a coating layer on a substrate to transform the coating layer to enhance one or more electrical properties of the coating layer. Embodiments described herein include an electrical component having a coating layer that is transformed by energy from an electron beam to enhance electrical properties of the coating layer to form an electrical conductor.

Embodiments described herein may include an electrical component having the form of a circuit board with electrical conductors forming circuits thereon, the electrical conductors being processed by an electron beam. Other types of electrical components may be manufactured using the systems and methods described herein.

Embodiments described herein may achieve a high quality electrical conductor by using a non-adiabatic electron beam processing technique. For example, heat may be generated inside the coating layer quickly (e.g. within microseconds), which may transform the coating layer to enhance properties of the coating layer. The heat may be used to melt or remelt some or all of the compounds or materials of the coating layer. In other embodiments, the electrons of the electron beam may react with materials of the coating layer to transform the coating layer into a conductive structure. Some of the material of the coating layer may be segregated and/or evaporated by the electron beam during processing to transform the composition of the coating layer. The material used for the coating layer may be selected to function well with the electron beam processing.

Embodiments described herein may provide a coating layer and electrical conductor with substantially all residual non-metallic (e.g. organic) material from the paste or ink (used to apply the coating layer to the substrate) removed during electron beam processing of the coating layer. The post-processed electrical conductor may be a dense, pore-free metallic coating. The coating layer may have an initial concentration of non-metallic material (e.g. binder) that is lower, even much lower, than conventional paste (e.g. paste that is processed in a thermal oven). The coating layer may have a final concentration of non-metallic material (e.g. binder) that is lower, even much lower, than components made with conventional paste (e.g. processing in a thermal oven).

Embodiments described herein may enhance or select control parameters to achieve a high quality electrical conductor. The interaction of the electron beam with the applied coating layer and substrate may be considered. For example, the interaction of parameters including the metal ink composition, the printing technique (e.g. micro dispensing, screen printing, pad printing, ink jet printing, aerosol jet printing, and the like), and/or the electron beam levels may be considered and balanced.

Embodiments described herein produce an electrical conductor that may have properties necessary to provide stable electro-mechanical performance throughout the lifetime of the electrical component. For example, the electrical conductor may have a low and stable electrical contact resistance and good resistance to environmental degradation factors such as corrosive gas or high temperature exposures. The electron beam may be precisely controlled allowing for high spatial resolution of the electrical conductor. The finish of the electrical conductor may be controlled by the electron beam process and the materials of the coating layer to achieve the desired properties. For example, the electrical conductor may have appropriate coating qualities such as layer composition, film thicknesses, roughness, topography, structure, and the like.

FIG. 1 illustrates an electrical component 100 being processed to form an electrical conductor 102 on a substrate 104. During processing, a coating layer 106 is applied on an outer surface 108 of the substrate 104. The coating layer 106 is processed by an electron beam 110 generated from an irradiation source 112. FIG. 1 illustrates the electrical component 100 at different stages or states of the processing. For example, at 120, the coating layer 106 of the electrical component 100 is shown at a pre-processing state. At 122, the coating layer 106 of the electrical component 100 is shown at a processing state, at which the electron beams 110 at least partially penetrate the coating layer 106. The coating layer 106 is irradiated to transform one or more properties of the material of the coating layer 106. The coating layer 106 may be transformed into a conductive structure, such as a circuit of the electrical component 100. At 124, the coating layer 106 of the electrical component 100 is shown at a post-processing state, after irradiation from the electron beam 110.

Figure 2:
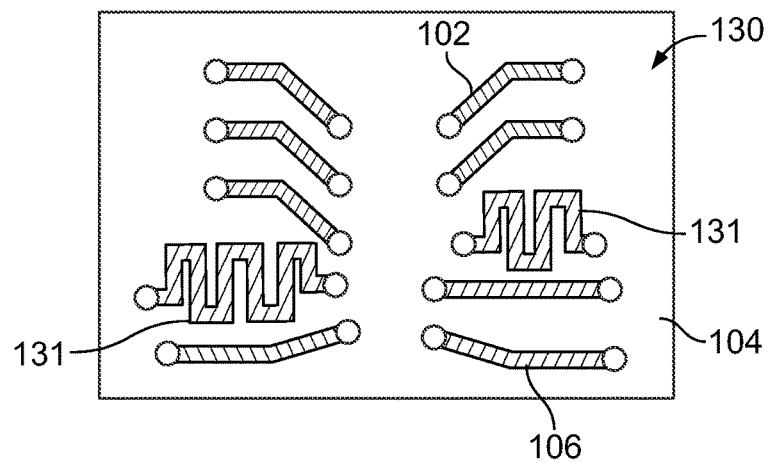
FIG. 2 illustrates a circuit board manufactured using an electron beam to irradiate selectively deposited coating layers to form electrical conductors in the form of conductive traces defining circuits.

In an exemplary embodiment, the substrate 104 may be a non-metallic substrate. For example, the substrate 104 may be a plastic material, an FR-4 material, a ceramic material, a glass epoxy material, a foil, a semi-conductor or another type of dielectric material as the base material. The substrate 104 may be used to form a circuit board or an antenna structure. With additional reference to FIG. 2, FIG. 2 illustrates a circuit board 130, in accordance with an exemplary embodiment, defining an electrical component 100 manufactured using the electron beam 110 to irradiate selectively deposited coating layers 106 to form electrical conductors 102 in the form of conductive traces defining circuits. Optionally, different portions of the coating layer 106 may be irradiated differently, such as to form a resistor 131 or a resistor network in one or more of the electrical conductors 102. The resistors 131 may be formed by processing the electrical conductors 102 and/or depositing a coating layer 106 having a high resistance. The resistors 131 may be incorporated into the electrical conductor 102 paths or circuits by variation of the parameters of the electron beam 110 during irradiation. No assembly or mounting of resistors to the circuit board 130 is then necessary.

Returning to FIG. 1, at or prior to the pre-processing state 120, the coating layer 106 may be applied by printing a conductive or metallic ink or paste on the outer surface 108. Optionally, the coating layer 106 may be applied directly to the outer surface 108. Alternatively, one or more layers may be provided between the substrate 104 and the coating layer 106. The substrate 104 may be cleaned, de-oxidized, and/or chemically activated prior to printing the coating layer 106 on the outer surface 108, in order to enhance the adhesion of the coating layer 106 to the outer surface 108.

In an exemplary embodiment, the coating layer 106 includes metal particles of various shapes and sizes. The coating layer 106 may include a binder to promote as-printed adhesion and/or a surfactant to prevent metal particle agglomeration (e.g. 1-2 wt %). The coating layer 106 may include a solvent and/or process aids needed for the printing process(es). Optionally, the coating layer 106 may contain additional flux additives (e.g. commercial brazing flux, borax, and potassium-tetraborate), such as at levels between 1 and 10 wt %. The flux may be added to adjust a wetting behavior of the coating layer 106 during post processing with the electron beam 110. In an exemplary embodiment, the coating layer 106 may have a high metal concentration (e.g. greater than 50 wt %). In an exemplary embodiment, the metal particles may be 100% silver particles. Other types of metals may be used in alternative embodiments, such as gold, copper, nickel, tin, zinc, titanium, palladium, platinum, and the like and/or alloys thereof. The coating layer 106 material may include metal precursors which can be chemically reduced to metals. For example, metal salts, metal oxides, and other metal compounds may be used, such as silver chloride, tin chloride, and silver nitrate. The precursors may include metals having low melting points, such as tin, zinc, copper, silver, and the like. When using a mixture of metals or alloys, intermetallic structures may be created during the electron beam processing to achieve desired characteristics or properties for the coating layer 106.

In an exemplary embodiment, the coating layer 106 may be a microstructure structure of micro particles and/or nano-particles. Optionally, the coating layer 106 may include a mixed powder of solid metal particles, such as Sn and Ag particles, with a binder, solvent and/or flux mixture. The metal particles are melted with the electron beam 110 to generate a solution where the materials are mixed on the atomic scale. Optionally, the coating layer 106 may be rapidly cooled to quickly solidify the solution to inhibit phase separations and grain growth. Having good mixture of the materials and having quick solidification, leads to a fine material microstructure. Optionally, differently sized and shaped metal particle may be used. Precursors, which are reduced to metallic particles during the irradiation and melting process (e.g. metal salts, metal oxides) may be used. Optionally, a diffusion barrier layer may be provided between the substrate 104 and the coating layer 106, such as to reduce interdiffusion between the material of the substrate 104 and the material of the coating layer 106.

The binder concentration may be relatively low (e.g. less than 5 wt %), such as compared to the metal particle concentration. The binder concentration may be relatively low compared to conventional pastes that are used in conventional thermal oven post-treatment applications. The binder concentration may be between approximately 25 wt % and 5 wt %. Alternatively, the binder concentration may be very low (e.g. less than 1 wt %). Examples of binders include dextrins, polyvinyl butyral resins (e.g. Butvar), hydroxypropylcellulose (e.g. Klucel®), but other types of binders may be used in alternative embodiments. The binder may include glue or other additives to change a viscosity of the coating material for ease of application to the substrate 104.

The coating layer 106 may be applied by one of various different printing techniques, such as screen printing, pad printing, ink jet printing, aerosol jet printing, micro dispensing, spin coating, a wiping application and the like. Other application techniques other than printing may be used in alternative embodiments to apply the coating layer 106 to the substrate 104. For example, the coating layer 106 may be applied by powder coating, spraying, dip immersion or other processes. The application technique may selectively apply the coating layer 106 to the substrate 104, such as along a predetermined circuit trace path. The printing technique may allow for a standardized pattern to be printed on the substrate 104, and the printing may be done in a batch printing application or a continuous reel printing application. The printing technique may be chosen according to the smallest structure sizes of the paste or ink, the layer thicknesses being applied, the composition of the coating layer material, and the like.

Figure 3:
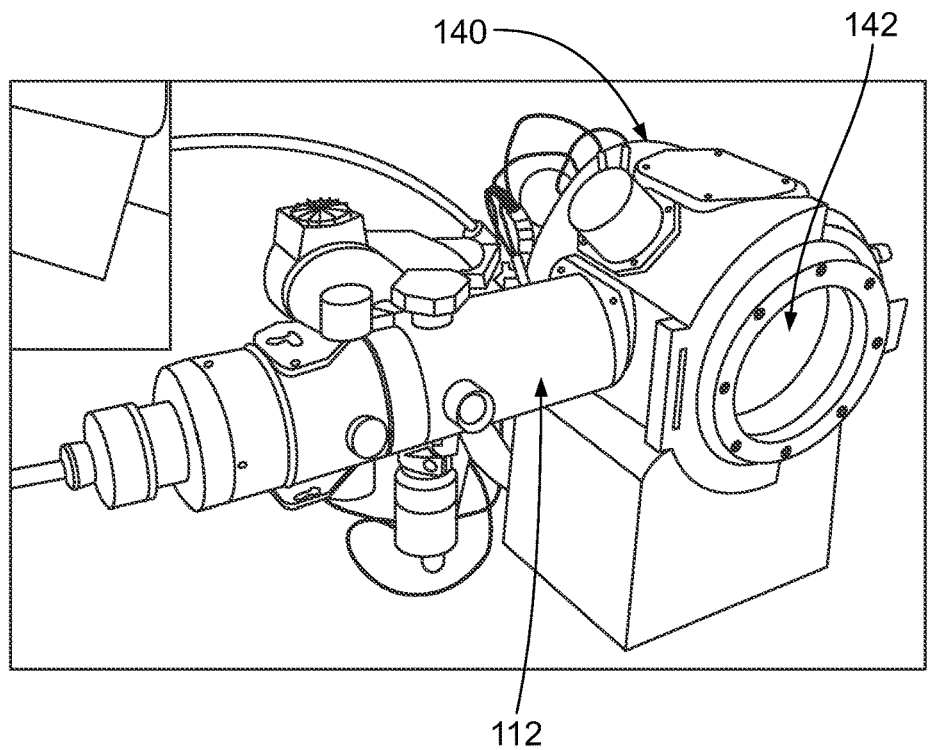
FIG. 3 illustrates an electrical component forming system in accordance with an exemplary embodiment.

With additional reference to FIG. 3, FIG. 3 illustrates a electrical component forming system 140 used to irradiate the electron beam 110 at the electrical component 100 in accordance with an exemplary embodiment. The system 140 may be an electron beam micro welder capable of producing the electron beam 110. The processing may be performed in a vacuum chamber 142. The power of the irradiation source 112 may be controlled during processing. The energy density of the electron beam 110 may be controlled during processing. The deflection speed of the electrons may be controlled during processing. The maximum acceleration voltage may be controlled during processing. The maximum electron beam current may be controlled during processing. The beam focus spot size and depth on the target may be controlled during processing. The electron beam 110 may be controlled based on properties of the deposited layer (e.g. layer thickness, layer composition) and the material properties of the coating layer 106 (e.g. density, thermal conductivity, chemical composition). The coating layer 106 and/or the substrate 104 may be heated to a temperature below the melting point to change characteristics of the layer(s) by reacting materials and/or sintering the layer(s).

The system 140 may be equipped with both a backscatter electron and a secondary electron detector which can be used to produce electron beam images of the work piece, similar to a Scanning Electron Microscope (SEM). The images can be viewed live on a screen or saved using a computer. The system 140 may include software to control the functions of the irradiation source 112, such as to program the electron beam 110 to scan defined paths over the sample or to irradiate defined patterns. The electron beam paths may be sweeping paths, scanning paths, spiral paths or other irregular paths. The software may allow synchronous movement of the electron beam 110 with the irradiated sample, such as a continuously moved reel. In such a way, a continuous remelting process is possible. Optionally, the system 140 may include a heat sink, such as a thick aluminum plate heat sink having a high thermal mass and positioned in good thermal contact with the target.

Figure 4:
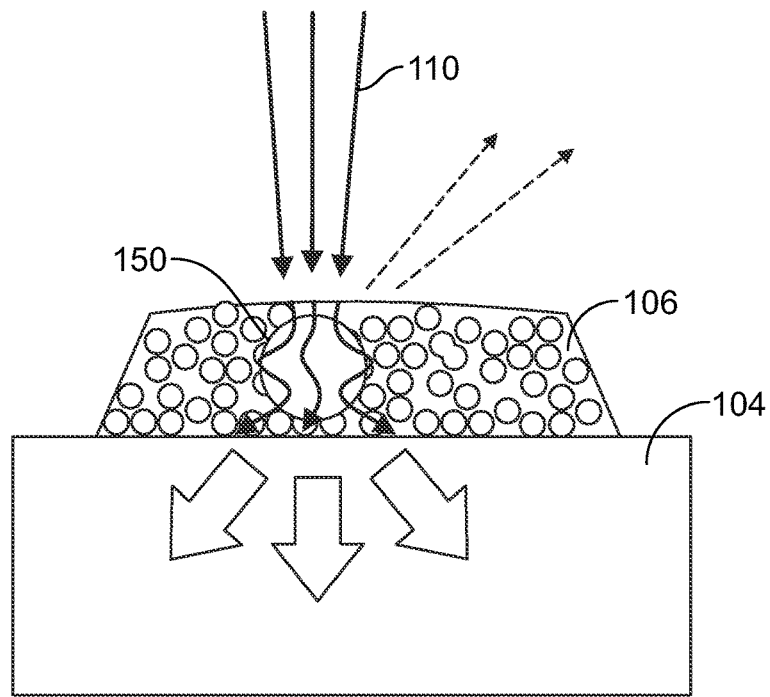
FIG. 4 illustrates the interaction of the electron beam with the coating layer.

FIG. 4 illustrates the interaction of the electron beam 110 with the coating layer 106. The electron beam 110 is focused internal of the coating layer 106. The electron beam 110 at least partially penetrates the coating layer 106. In an exemplary embodiment, a beam focus spot 150 is in the coating layer 106 rather than in the substrate 104. Irradiation or heating of the substrate 104 is limited by having the electron beam 110 focused on the coating layer 106. The electron beam 110 is used to irradiate the material of the coating layer 106 to achieve electrical conductivity within the coating layer. As the impinging electrons of the electron beam 110 are scattered by the material of the coating layer 106, kinetic energy of the electrons is converted into heat energy. The scattering probability may be dependent on the energy of the electrons, on the density of the irradiated material of the coating layer 106, on the beam focus depth, and the like. Optionally, the penetration depth of the electron beam may be between 0.5 μm and 20 μm. In an exemplary embodiment, a characteristic of the energy dependence of the scattering probability is that the maximum of the generated heat density does not lie at the surface of the material but at about ⅓ of the penetration depth. Heat is generated not only at the surface but inside the material of the coating layer 106.

A part of the electrons are reflected or re-emitted from the coating layer 106. Such electrons can be utilized to generate in-situ SEM pictures during irradiation, such as to control the irradiation process via a feedback control system.

The power of the heat which is generated is dependent on the electron current for a fixed acceleration voltage. The product of the acceleration voltage and the beam current gives the power of the beam. The power can be adjusted by controlling the electron current and/or the acceleration voltage. Another parameter that may be adjusted to control the irradiation process is the duration of irradiation at or near a spot of the coating layer 106. The printed material of the coating layer 106 melts if the generated heat exceeds the thermal energy needed to heat the material to its melting point and the latent heat of fusion of the material. Having the heat energy focused in the coating layer 106, as opposed to the substrate 104, generates heat and melting of the coating layer 106 very quickly. Optionally, the substrate 104 may act as a heat sink to quickly dissipate heat from the coating layer 106 after irradiation enabling high cooling rates of the molten film. Quick heating and cooling rates may affect the properties of the electrical conductor formed by the coating layer 106. For example, the hardness of the electrical conductor may be higher with quick heating and cooling as opposed to slow heating and cooling of the coating layer 106, as is typical of thermal curing in a thermal oven where the substrate 104 is heated in addition to the paste. Additionally, more heat energy is needed to heat the paste in a thermal oven because the substrate is heated in addition to the paste. Optionally, since the heat can be generated primarily or only in the coating layer 106, the use of thermally sensitive substrates 104 may be possible. The quick heating and cooling of the coating layer 106 may avoid heating of the substrate 104 by heat conduction.

Since the binders typically have a mass density an order of magnitude lower than the metal particles in the coating layer 106, the volume percentage of the binders in the coating layer 106 are even higher. For instance, a conventional paste typical for use in an application cured in a thermal oven is a 90Ag/10Mo material with 23 wt % Butvar binder, which is a high binder concentration and is borderline very high binder concentration. Such conventional paste has a binder volume fraction of approximately 75%. The high or very high binder concentrations of conventional pastes is needed to securely fix the printed structures onto the substrate and the binder remains post thermal treatment using conventional thermal ovens.

In an exemplary embodiment, for processing with the electron beam 110, the coating layer 106 does not require such a high binder content as the binder is only needed to keep the printed coating layer 106 adhered to the substrate 104 long enough to transfer the substrate 104 to the electron beam 110 for irradiation. For example, a binder content may be approximately 1 wt %, greatly reducing the volume percentage as well. After melting, the coating layer 106 is dense and has good adhesion to the substrate. In an exemplary embodiment, the binder is intended to be substantially entirely removed from the coating layer 106 during the irradiation process, such as by evaporation or by decomposition. Using a low concentration of binder in the coating layer 106 allows quicker and more thorough evaporation or removal of the binder during irradiation. A binder having properties such as high paste quality, high printed film adhesion, film quality of the coating layer 106 after irradiation (e.g. low concentration of carbon residue (char) after irradiation), and the like are considered when selecting the binder material. Examples of binders include dextrins, polyvinyl butyral resins (e.g. Butvar), hydroxypropylcellulose (e.g. Klucel®), but other types of binders may be used in alternative embodiments. In an exemplary embodiment, all or substantially all of the binder is irradiated by the electron beam 110 and a low amount of carbon residue remains, which may be removed by scraping or another processing technique.

During processing, the operation of the electron beam 110 may vary based on the type of material of the coating layer 106. For example, the operation may be different when using pure metallic material versus using metal precursors. In an exemplary embodiment, in the case of the pure metallic components, the post-processing and irradiation of the coating layer 106 may be controlled by adjusting the energy density and exposure time in such a way that the metal particles sinter or at least one of the metallic components goes into the melt phase and the coating layer 106 fuses into a homogeneous metallic layer. A two-step process with sintering and subsequent melting is possible in some embodiments. The non-metallic components (e.g. the binder) are segregated or vaporized leaving the pure metallic layer. In an exemplary embodiment, in the case of the metal precursors, the post-processing and irradiation of the coating layer 106 is controlled by the energy density and exposure time in such a way that the metal precursors are chemically reduced to metals, either indirectly by the heat input into the coating layer 106 or directly by interaction of the metal precursors with the electrons of the electron beam 110. The non-metallic components (e.g. the binder) are segregated or vaporized leaving the metallic layer. The coating layer 106 may transform into a homogeneous metallic layer when the precursors are chemically altered by the electron beam 110.

The thermal energy generated by the electron beam 110 inside the coating layer 106 can be controlled by adjusting parameters of the electron beam 110. At low heat energies and long irradiation times, the coating layer 106 may be only partially melted and may not bond to the substrate 104. At low heat energies and long irradiation times the particles of the coating layer 106 may be only sintered and not completely melted. In such situations, the coating layer 106 may not adhere well to the substrate 104 and may be easily displaced mechanically over time. At low heat energies but short irradiation times, portions of the coating layer 106 may be removed by the electron beam, such as by splattering away the material upon irradiation. At higher energies, large dewetted drops and three dimensional islands may remain, which is undesirable. At even higher energies, such as when the energy is too high, the substrate 104 may melt in addition to the coating layer 106, which provides a poorer electrical interface. The energy level of the electron beam 110 should be controlled to achieve melting of the coating layer 106 while having good covering of the substrate 104 and without excessive damage to the substrate 104.

During use, particle blowing or spattering of the coating layer 106 may occur at any energy level. Several physical effects explain the effect of metal particle blowing: a) transfer of momentum, b) electrostatic effects, c) electrodynamic effects, and d) thermodynamic effects. To reduce particle blowing, the amount of non-metallic components may be reduced or minimized, since the less filler there is between the particles, the higher the number of conductive paths between the particles there are to 'bleed off' excessive charge to ground. To reduce particle blowing, the coating layer 106 may be preheated such that lower beam power is required before the actual melting. For example, the coating layer 106 may be preheated to a temperature below the melting point of the coating layer 106, such as in a thermal oven, using the electron beam, or otherwise. During the irradiation process, the coating layer 106 is then further heated to a temperature above the melting point of the coating layer 106. To reduce particle blowing, larger particle sizes of the material of the coating layer 106 may be used or particles of irregular (non-spherical) shapes may be used to reduce effects of particle blowing, since more mechanical contacts between the particles could increase the forces to move particles relative to each other, as well as possibly creating more conductive paths. To reduce particle blowing, the scanning or irradiation pattern may be selected to heat the material of the coating layer 106 indirectly via heat conduction, such as through the substrate 104. To reduce particle blowing, the material composition of the coating layer may have a high metal particle density and/or low porosity to increase the electrical and heat conductivity.

To avoid potential electrical charging of the substrate 104 during irradiation with the electron beam 110, the coating layer 106 may be grounded. To avoid potential electrical charging of the substrate 104 during irradiation with the electron beam 110, the electron beam 110 may be operated at low accelerating voltages to increase electron emission. To avoid potential electrical charging of the substrate 104 during irradiation with the electron beam 110, a light (e.g. UV or laser) may be used to increase the photoconductivity of the coating layer 106. To avoid potential electrical charging of the substrate 104 during irradiation with the electron beam 110, the coating layer 106 may be processed at an increased pressure (e.g. with argon partial pressure).

In an exemplary embodiment, the control of the electron beam 110, such as the amount of thermal energy generated by the electron beam 110, may be varied along the coating layer 106. For example, by changing operation of the electron beam 110 along one portion of the coating layer 106 as compared to another portion of the coating layer 106 the characteristics of the coating layer 106 may be varied. For example, resistors may be incorporated into the electrical conductor paths or circuits by variation of the parameters of the electron beam 110. No assembly or mounting of resistors is then necessary. In an exemplary embodiment, the irradiation source 112 may producing the electron beam 110 at a power of approximately 2 kW; however it may be more or less in other embodiments. The electron beam 110 may have an acceleration voltage of approximately 60 kV; however it may be more or less in other embodiments. The electron beam 110 may have an electron beam current of between approximately 0.15 mA and 15 mA; however it may be more or less in other embodiments, such as approximately 40 mA. The beam focus spot size on the coating layer 106 may be approximately 100 µm; however it may be more or less in other embodiments, such as between approximately 30-50 µm. The electron beam 110 may have an irradiation time durations of between approximately 12 µs/spot and 1000 µs/spot; however it may be more or less in other embodiments.

Figure 5:
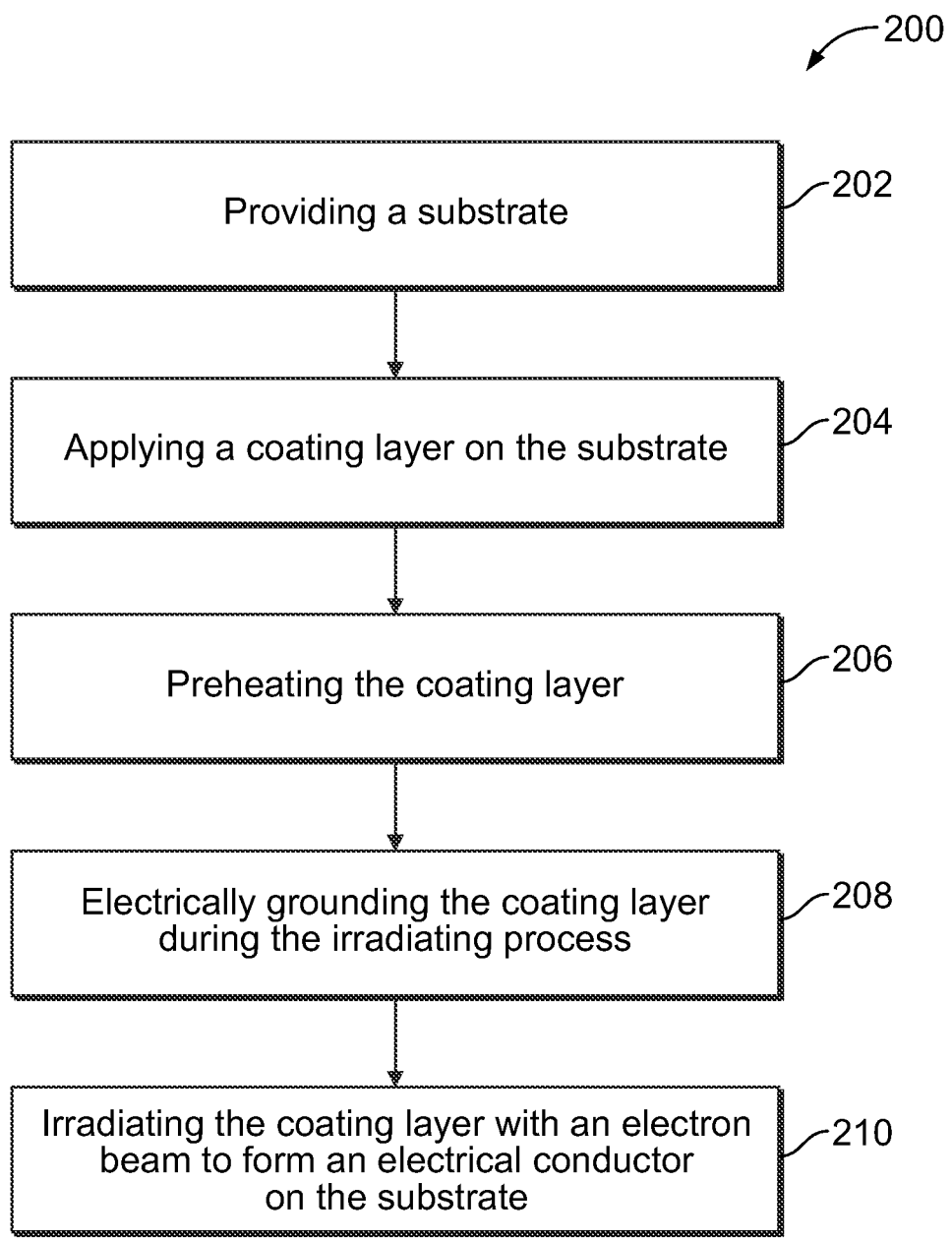
FIG. 5 illustrates a method of manufacturing an electrical component.

FIG. 5 illustrates a method 200 of manufacturing an electrical component, such as a circuit board, an antenna, and the like. The method 200 includes providing 202 an electrically insulating substrate having an outer surface. The substrate may include an insulative base, such as plastic, glass, ceramic and the like, such as for use in making a circuit board.

The method 200 includes applying 204 a coating layer on the outer surface of the substrate. The coating layer may be a paste or ink. The coating layer may be a powder or may have other forms. The coating layer includes a high concentration of metallic particles to form a high quality electrical conductor, such as a circuit trace or a coating on the substrate. Optionally, the coating layer may include binder to secure the coating layer to the substrate. The binder concentration may be low, with the intention of removing substantially all of the binder during processing. The coating layer may include precursors, such as metal oxides or metal salts that are processed at a later step.

The coating layer may be applied 204 by printing the coating layer on the substrate. For example, the coating layer may be screen printed, pad printed, ink jet printed, aerosol jet printed. The coating layer may be applied by micro dispensing, spin coating, a wiping application, powder coating, spraying, dip immersion or other processes. The coating layer may be applied directly to the outer surface of the substrate. Alternatively, other layers may be provided therebetween.

The method 200 includes preheating 206 the coating layer prior to other processing steps, such as processing the coating layer with an electron beam. The coating layer may be preheated to a temperature below a melting point of the coating layer prior to other processing steps, where the temperature may be increased to a temperature above the melting point of the coating layer.

The method 200 includes electrically grounding 208 the coating layer prior to other processing steps, such as processing the coating layer with an electron beam. The grounding 208 may reduce sputtering of the coating layer during processing with the electron beam.

The method 200 includes irradiating 210 the coating layer with an electron beam to form an electrical conductor on the substrate. The electron beam may be spot focused within the coating layer, such as at about ⅓ to ⅔ of the depth of the coating layer, making it possible to generate heat not only at the surface of the material but inside the material. The irradiation with the electron beam may heat the coating layer to melt the coating layer to form the electrical conductor. Optionally, such as when metal precursors are used in the coating layer, the metal precursors may interact with the electrons of the electron beam during irradiation to transform the coating layer into a conductive structure. The electron beam may chemically reduce the metal precursors to metals to form the electrical conductor.

The irradiating 210 may vaporize substantially all the binder or non-metallic material of the coating layer leaving a substantially pure metallic layer to form the electrical conductor. The coating layer may be irradiated until the non-metallic material of the coating layer is completely removed. The irradiation process may be controlled, such as by controlling operating parameters of the electron beam, based on the properties of the coating layer, such as the thickness, composition, concentration of binder, and the like. Optionally, different portions of the coating layer may be irradiated differently, such as to form a resistor in the electrical conductor. The electrical component may be a structured electrical component. For example, layers of the electrical component may be printed in a structured way and irradiated via an electron beam to get predefined properties in one or more of the layers. The electrical component may be laminated or printed on or in a way to define a plane structure. Electron beams may irradiate all or selected portions of the layered structure, and then excess laminated/printed material may be removed.

The methods and systems described herein of processing a coating layer 106 with an electron beam 110 achieve a high quality electrical conductor for an electronic component. The process may be performed without wet chemistry and at reduced environmental impact. The metal consumption for manufacturing the electrical component may be reduced as compared to other manufacturing techniques. The process achieves high selectivity and precise placement of the coating layer 106. The coating layer 106 and electronic component may be processed quickly, and may be processed as part of a continuous reel-to-reel system or a batch system. The electrical conductors defined by the processed coating layer 106 provide improved properties compared to standard procedures. For example, the conductors may have increased electrical conductivity, increased thermal conductivity, better corrosion resistance, increased hardness, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc., are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A method of manufacturing an electrical component, the method comprising:
   providing an electrically insulating substrate having an outer surface;
   applying a coating layer, including metallic material and non-metallic material, on the outer surface by selectively printing the coating layer in a circuit pattern on the outer surface, the coating layer having an interior volume defined between an inner surface of the coating layer on the outer surface of the substrate and an outer surface of the coating layer opposite the inner surface of the coating layer; and
   irradiating the entire coating layer with an electron beam at a beam focus spot in the interior volume remote from the inner surface of the coating layer and remote from the outer surface of the coating layer at a depth of between ⅓ and ⅔ of a depth of the coating layer, said irradiating causes electrons of the electron beam to interact with the metallic material and the non-metallic material in the interior volume of the coating layer to change the chemical structures of the metallic material and the non-metallic material of the coating layer in the interior volume of the coating layer until the non-metallic material of the coating layer is completely removed to form an electrical conductor devoid of the non-metallic material on the substrate.

2. The method of claim 1, wherein said irradiating comprises transmitting the electron beam such that electrons of the electron beam at least partially penetrate the coating layer.

3. The method of claim 1, said irradiating the coating layer comprises using non-adiabatic electron beam processing.

4. The method of claim 1, wherein said irradiating the coating layer comprises heating the coating layer to melt the coating layer to form the electrical conductor.

5. The method of claim 1, wherein the coating layer includes metal precursors, said irradiating the coating layer comprises irradiating the coating layer to chemically reduce the metal precursors to metals to form the electrical conductor.

6. The method of claim 1, further comprising preheating the coating layer to a temperature below a melting point of the coating layer during a preheating process, said irradiating the coating layer comprises heating the preheated coating layer to a temperature above the melting point of the coating layer.

7. The method of claim 1, wherein said applying a coating layer comprises applying a coating layer having a combination of binder and metal concentrations, said irradiating the coating layer comprises vaporizing the binder leaving a metallic layer to form the electrical conductor.

8. The method of claim 1, wherein said applying a coating layer comprises applying a coating layer having a metal precursor, said irradiating the coating layer comprises reacting the metal precursors with the electrons of the electron beam to transform the coating layer into a conductive structure.

9. The method of claim 1, wherein said irradiating the coating layer comprises irradiating different portions of the coating layer differently to form a resistor in the electrical conductor.

10. The method of claim 1, wherein said irradiating the coating layer comprises controlling operating parameters of the electron beam based on the properties of the coating layer.

11. The method of claim 1, wherein said applying a coating layer comprises printing the coating layer directly on the outer surface of the substrate.

12. The method of claim 1, further comprising electrically grounding the coating layer during the irradiating process.

13. The method of claim 1, wherein said irradiating the coating layer comprises controlling energy density of the electron beam during processing.

14. The method of claim 1, wherein said irradiating the coating layer comprises controlling deflection speed of electrons of the electron beam during processing.

15. The method of claim 1, wherein said irradiating the coating layer comprises controlling maximum acceleration voltage of electrons of the electron beam during processing.

16. The method of claim 1, wherein said irradiating the coating layer comprises controlling maximum electron beam current of electrons of the electron beam during processing.

17. The method of claim 1, wherein said irradiating the coating layer comprises controlling an electron beam focus spot size and an electron beam focus depth within the coating layer during processing.

18. The method of claim 1, wherein said irradiating the coating layer comprises uniformly heating the interior volume of the coating layer.

19. The method of claim 6, wherein said preheating the coating layer comprises irradiating the coating layer with an electron beam to a preheated temperature below the melting point of the coating layer.

* * * * *